(12) United States Patent
Toyoda et al.

(10) Patent No.: US 9,972,666 B2
(45) Date of Patent: May 15, 2018

(54) DISPLAY DEVICE

(71) Applicant: Japan Display Inc., Minato-ku (JP)

(72) Inventors: Hironori Toyoda, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/451,796

(22) Filed: Mar. 7, 2017

(65) Prior Publication Data
US 2017/0278911 A1 Sep. 28, 2017

(30) Foreign Application Priority Data

Mar. 25, 2016 (JP) .................. 2016-062677

(51) Int. Cl.
| | |
|---|---|
| *H01L 33/50* | (2010.01) |
| *H01L 27/32* | (2006.01) |
| *H01L 51/52* | (2006.01) |
| *H01L 33/60* | (2010.01) |
| *H01L 51/50* | (2006.01) |
| *B82Y 20/00* | (2011.01) |

(52) U.S. Cl.
CPC ........ *H01L 27/3246* (2013.01); *H01L 27/322* (2013.01); *H01L 33/50* (2013.01); *H01L 33/504* (2013.01); *H01L 33/60* (2013.01); *H01L 51/50* (2013.01); *H01L 51/5268* (2013.01); *H01L 51/5271* (2013.01); *B82Y 20/00* (2013.01); *H01L 2251/5369* (2013.01); *Y10S 977/774* (2013.01); *Y10S 977/824* (2013.01); *Y10S 977/952* (2013.01)

(58) Field of Classification Search
CPC ..... H01L 51/50; H01L 51/52; H01L 51/5246; H01L 51/5262; H01L 51/5268; H01L 51/5271; H01L 33/50; H01L 33/504; H01L 33/60
See application file for complete search history.

(56) References Cited

U.S. PATENT DOCUMENTS

| | | | | |
|---|---|---|---|---|
| 2006/0258061 | A1* | 11/2006 | Jung | H01L 27/124 438/149 |
| 2007/0111369 | A1* | 5/2007 | Chun | H01L 27/3246 438/99 |
| 2007/0182706 | A1* | 8/2007 | Cassidy | G02B 5/0808 345/107 |
| 2008/0164807 | A1* | 7/2008 | Hofmann | H01L 51/5268 313/504 |
| 2012/0069425 | A1* | 3/2012 | Sato | G09G 3/3446 359/296 |
| 2013/0009542 | A1* | 1/2013 | Lee | H01L 51/5228 313/504 |
| 2015/0001464 | A1 | 1/2015 | Fukuura | |
| 2017/0176816 | A1* | 6/2017 | Han | G02F 1/133617 |

FOREIGN PATENT DOCUMENTS

JP          2013-93317        5/2013

* cited by examiner

*Primary Examiner* — Eduardo A Rodela
(74) *Attorney, Agent, or Firm* — Oblon, McClelland, Maier & Neustadt, L.L.P.

(57) ABSTRACT

A display device includes a pixel electrode, a pixel isolation insulating film in which an opening through which the pixel electrode is exposed at a bottom is formed, and a light-emitting layer formed inside the opening. The pixel isolation insulating film contains particles that receive light emitted from the light-emitting layer and propagate light in a direction different from that of the light emitted from the light-emitting layer.

10 Claims, 7 Drawing Sheets

DISPLAY DEVICE

CROSS-REFERENCE TO RELATED APPLICATION

The present application claims priority from Japanese application JP2016-062677 filed on Mar. 25, 2016, the content of which is hereby incorporated by reference into this application.

BACKGROUND OF THE INVENTION

1. Field of the Invention

The present invention relates to a display device.

2. Description of the Related Art

In a display device such as an organic EL display device, an opening to expose a pixel electrode is formed in an insulating film deposited above the pixel electrode, and a light-emitting layer may be formed in the opening.

SUMMARY OF THE INVENTION

In the above display device, light emitted from the light-emitting layer formed in the opening of the insulating film may enter into the insulating film, so that there is a risk that the light may not be used for display.

The invention has been made in view of the above problem, and it is an object of the invention to provide a display device capable of improving the use efficiency of light emitted from a light-emitting layer.

A display device includes a pixel electrode, a pixel isolation insulating film in which an opening through which the pixel electrode is exposed at a bottom is formed, and a light-emitting layer formed inside the opening. The pixel isolation insulating film contains particles that receive light emitted from the light-emitting layer and propagate light in a direction different from that of the light emitted from the light-emitting layer.

DETAILED DESCRIPTION OF THE INVENTION

Figure 1:
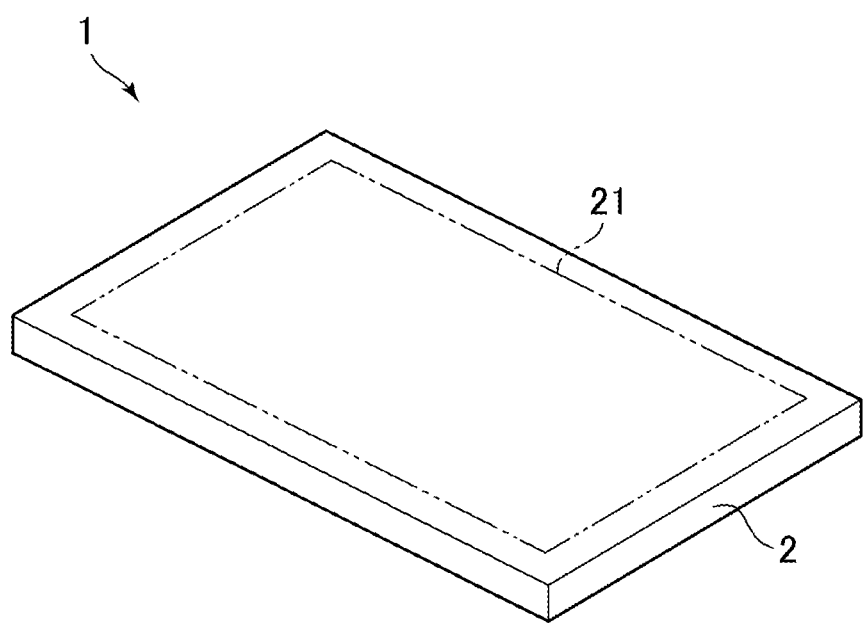
FIG. 1 is an external perspective view of a display device.

Hereinafter, an embodiment of the invention will be described with reference to the drawings. The disclosure is illustrative only. Appropriate modifications that will readily occur to those skilled in the art and fall within the spirit of the invention are of course included in the scope of the invention. For more clarity of description, the width, thickness, shape, and the like of each part may be schematically represented in the drawings, compared to those in the embodiment. However, they are illustrative only and do not limit the interpretation of the invention. Moreover, in the specification and the drawings, elements similar to those described in relation to a previous drawing are denoted by the same reference numerals and signs, and a detailed description may be appropriately omitted.

FIG. 1 is an external perspective view of a display device 1 according to the embodiment of the invention. The display device 1 is an organic EL display device including, for example, an organic light-emitting element (OLED). The display device 1 includes an array substrate 2, and a rectangular display region 21 where a plurality of pixels are arranged in a matrix is formed in the central portion of the array substrate 2. Hereinafter, the pixel structure of the pixel constituting the display region 21 will be described in detail.

[First Example of Pixel Structure]

Figure 2:
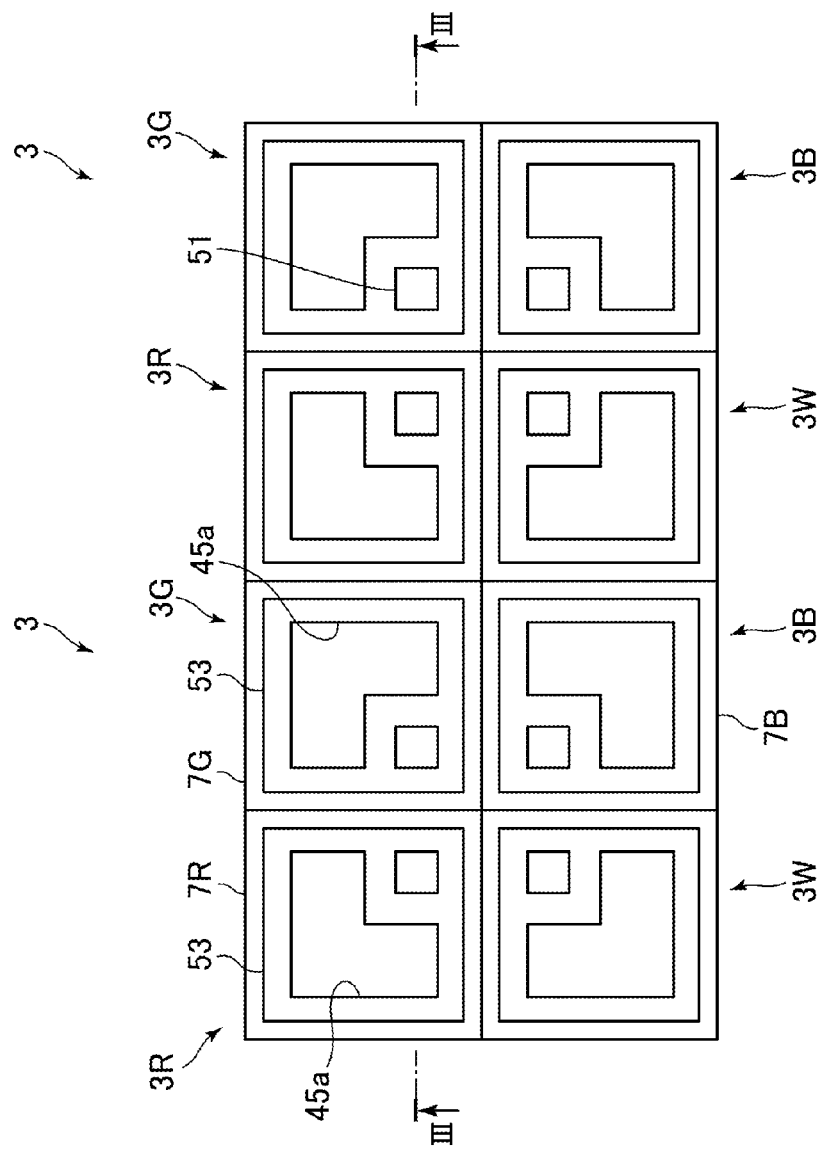
FIG. 2 is a plan view showing a first example of a pixel structure.
Figure 3:
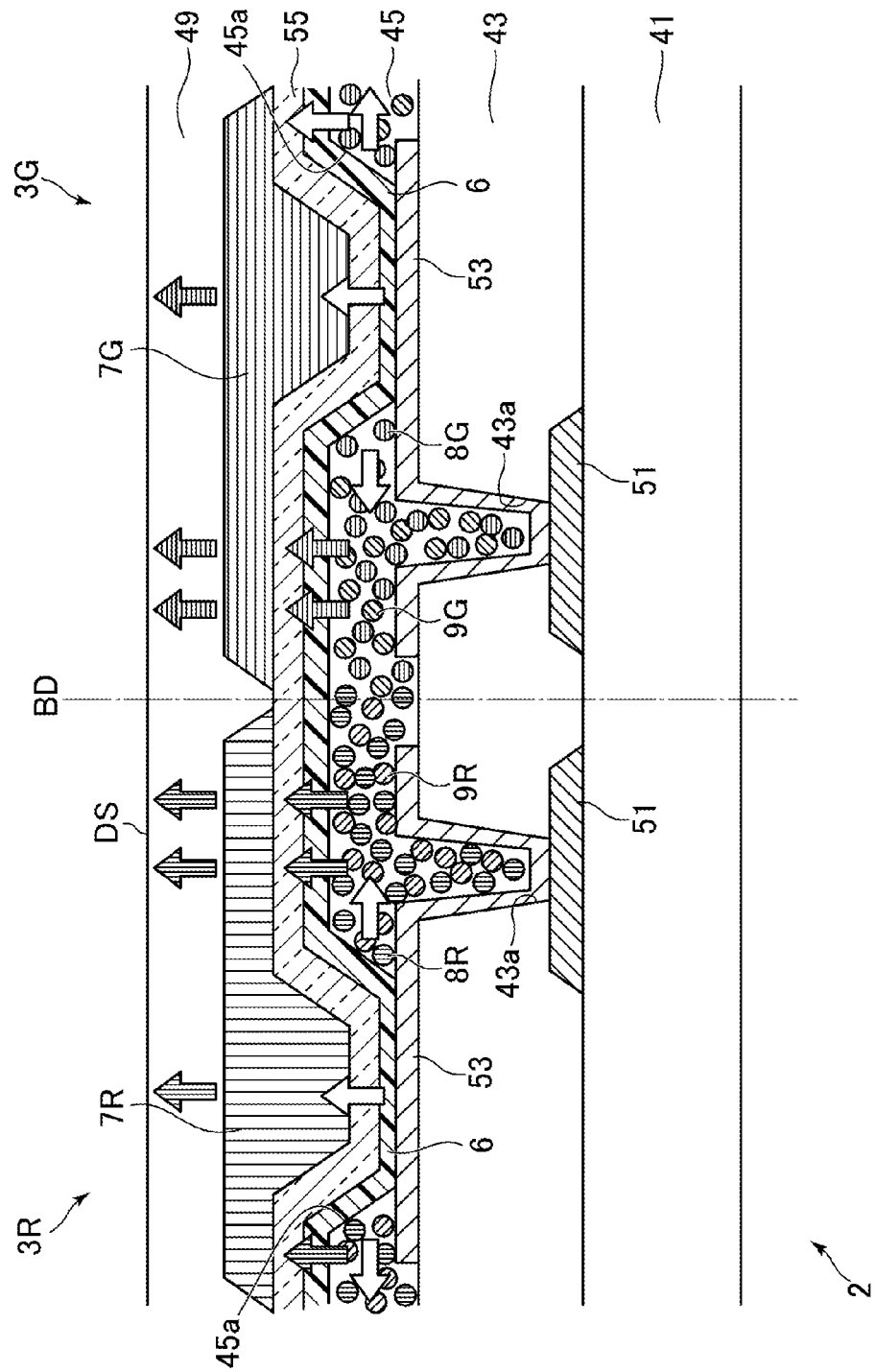
FIG. 3 is a cross-sectional view showing the first example of the pixel structure.

FIGS. 2 and 3 are a plan view and a cross-sectional view, respectively, showing a first example of the pixel structure. FIG. 3 schematically shows a cross-section taken along line III-III in FIG. 2. In FIG. 3, insulating films 41, 43, and 45 and a sealing material 49 are not hatched for clarity of illustration. In the following description, the direction of a display surface DS is defined as the upper direction.

In the embodiment, the array substrate 2 includes color filters 7R, 7G, and 7B, and a counter substrate is not bonded to the array substrate 2. The invention is not limited to this, and a counter substrate including color filters may be bonded to the array substrate 2.

As shown in FIG. 2, one pixel 3 includes a plurality of sub-pixels 3R, 3G, 3B, and 3W. In the embodiment, the sub-pixels 3R, 3G, 3B, and 3W of four colors, for example red, green, blue, and white, constitute one pixel 3. The invention is not limited to this, and one pixel may include sub-pixels of three colors, red, green, and blue, or may include cyan, magenta, and yellow sub-pixels.

In FIG. 3, a main portion is shown in an enlarged manner focusing on cross-sections of the red sub-pixel 3R and the green sub-pixel 3G of the plurality of sub-pixels 3R, 3G, 3B, and 3W constituting one pixel 3.

The array substrate 2 is a stacked body in which an insulating film, a conductor layer, and the like are stacked on a base material made of, for example, glass or resin having flexibility such as polyimide. Lower electrodes 51 corresponding to the respective sub-pixels are disposed on the insulating film 41. The lower electrode 51 is, for example, a portion of a TFT (not shown) that drives the sub-pixel, or an electrode connected to the TFT. The insulating film 41 is made of an inorganic insulating material such as, for example, silicon oxide or silicon nitride. The lower electrode 51 is made of conductive metal such as, for example, aluminum, silver, copper, nickel, or titanium.

The tops of the insulating film 41 and the lower electrodes 51 are covered by the insulating film 43. Pixel electrodes 53 corresponding to the respective sub-pixels are disposed on the insulating film 43. Openings 43a for connecting the pixel electrodes 53 to the lower electrodes 51 are formed in the insulating film 43. The insulating film 43 mainly contains an organic insulating material such as, for example, acrylic resin, and the surface thereof is planarized. The pixel electrode 53 is, for example, an anode. The pixel electrode 53 is made of conductive metal such as, for example, aluminum, silver, copper, nickel, or titanium, and includes a reflective surface.

The tops of the insulating film 43 and the pixel electrodes 53 are covered by the pixel isolation insulating film 45. Openings 45a through each of which the pixel electrode 53 is exposed at the bottom are formed in the pixel isolation insulating film 45. The pixel isolation insulating film 45 is also called a bank or rib. The opening 45a is formed so as to be contained in the pixel electrode 53 in a plan view, and exposes a portion of the pixel electrode 53 excluding the peripheral edge portion thereof and located inside the peripheral edge portion. The inner edge portion of the pixel isolation insulating film 45 that forms the opening 45a covers the peripheral edge portion of the pixel electrode 53, and has a tapered shape.

The pixel isolation insulating film 45 mainly contains a transparent organic material such as, for example, acrylic resin. Further, the pixel isolation insulating film 45 contains quantum dot particles 8 and metal colloid particles 9. That is, the pixel isolation insulating film 45 is an insulating film containing the quantum dot particles 8 and the metal colloid particles 9 dispersed in a transparent basic material. The details of the quantum dot particles 8 and the metal colloid particles 9 will be described later.

An organic film 6 including a light-emitting layer is formed inside the opening 45a of the pixel isolation insulating film 45. The organic film 6 covers the pixel electrode 53 exposed at the bottom of the opening 45a. The organic film 6 includes, for example, a hole injection layer, a hole transport layer, the light-emitting layer, an electron transport layer, and an electron injection layer in this order from the bottom. The invention is not limited to this, and it is sufficient that the organic film 6 includes at least a light-emitting layer. The light-emitting layer included in the organic film 6 emits, for example, white light. The organic film 6 is continuously formed over the plurality of sub-pixels, but the invention is not limited to this. The organic film 6 may be individually formed for each of the sub-pixels. Moreover, adjacent pixels may be formed so as to emit lights of colors different from each other.

The top of the organic film 6 is covered by a transparent counter electrode 55. The counter electrode 55 is continuously formed over the plurality of sub-pixels, and covers the entire organic film 6. The counter electrode 55 is, for example, a cathode. The counter electrode 55 is made of a transparent conductive material such as, for example, indium tin oxide (ITO) or indium zinc oxide (IZO).

The color filters 7R and 7G are disposed above the organic film 6. The color filters 7R and 7G are disposed at least above the openings 45a of the pixel isolation insulating film 45. White light that is emitted upward from the organic film 6 covering the pixel electrodes 53 inside the openings 45a and white light that is emitted downward and reflected upward by the pixel electrodes 53 pass through the color filters 7R and 7G and are extracted as lights of the respective colors.

In the example, the color filters 7R and 7G each cover, not only the top of the opening 45a of the pixel isolation insulating film 45, but the area from the opening 45a to a boundary BD between the sub-pixels 3R and 3G adjacent to each other. In other words, in the example, the boundary BD between the sub-pixels 3R and 3G adjacent to each other is defined by the outer edges of the color filters 7R and 7G.

The tops of the color filters 7R and 7G are covered by the transparent sealing material 49. The sealing material 49 mainly contains an organic insulating material such as, for example, epoxy resin, and the surface thereof is planarized. The surface of the sealing material 49 serves as, for example, the display surface DS. An insulating film made of an inorganic insulating material such as, for example, silicon oxide or silicon nitride may intervene between the color filters 7R and 7G and the sealing material 49. When the adjacent pixels are formed so as to emit lights of colors different from each other, the color filters 7R and 7G are unnecessary.

Hereinafter, the quantum dot particles 8 and the metal colloid particles 9, which are contained in the pixel isolation insulating film 45, will be described.

The quantum dot particles 8 and the metal colloid particles 9 are particles that receive the light emitted from the organic film 6 and propagate light at a specific wavelength in a direction different from that of the light emitted from the organic film 6. Specifically, white light that is emitted in the in-plane direction from the organic film 6 covering the pixel electrode 53 inside the opening 45a enters into the pixel isolation insulating film 45. When receiving the white light emitted from the organic film 6 and entering into the pixel isolation insulating film 45, the quantum dot particles 8 and the metal colloid particles 9 propagate light at a specific wavelength in various directions. Portion of the light travels in the direction of the display surface DS.

The quantum dot particles 8, which are, for example, nano-order semiconductor crystal, absorb light and emit fluorescence at a specific wavelength. The fluorescence wavelength of the quantum dot particles 8 varies according to the particle size. The quantum dot particles 8 contain, for example, cadmium selenium (CdSe).

The metal colloid particles 9, which are also called metal nanoparticles and are, for example, nano-order metal, absorb light at a specific wavelength by surface plasmon resonance and reflect light at other wavelengths. The absorption wavelength of the metal colloid particles 9 varies according to the particle size. That is, the reflection wavelength of the metal colloid particles 9 also varies according to the particle size. The metal colloid particles 9 contain, for example, gold (Au).

Especially when both the quantum dot particles 8 and the metal colloid particles 9 are contained, the effect of intensifying the fluorescence of the quantum dot particles 8 is obtained by the surface plasmon resonance of the metal colloid particles 9. For this reason, the pixel isolation insulating film 45 preferably contains both the quantum dot particles 8 and the metal colloid particles 9. The invention is not limited to this, and the pixel isolation insulating film 45 may contain either the quantum dot particles 8 or the metal colloid particles 9.

When receiving the white light emitted from the organic film 6, the quantum dot particles 8 and the metal colloid particles 9 propagate lights of colors corresponding to the colors of the color filters 7R and 7G. Here, the wavelength range of light that passes through the color filter 7 may not be completely the same as the wavelength range of light that is propagated by the quantum dot particles 8 and the metal colloid particles 9, and it is sufficient that the wavelength ranges at least partially overlap each other.

Specifically, quantum dot particles 8R and metal colloid particles 9R, which are contained in the red sub-pixel 3R, are adjusted in size so as to propagate red light, which is of the same color as the color filter 7R. When receiving the white light emitted from the organic film 6, the quantum dot particles 8R and the metal colloid particles 9R propagate the red light in various directions. Portion of the red light travels upward, passes through the color filter 7R, and reaches the display surface DS.

Similarly, quantum dot particles 8G and metal colloid particles 9G, which are contained in the green sub-pixel 3G, are adjusted in size so as to propagate green light, which is of the same color as the color filter 7G. When receiving the white light emitted from the organic film 6, the quantum dot particles 8G and the metal colloid particles 9G propagate the green light in various directions. Portion of the green light travels upward, passes through the color filter 7G, and reaches the display surface DS.

In the pixel isolation insulating film 45, the quantum dot particles 8R and the metal colloid particles 9R, which propagate the red light, are contained on one side of the boundary BD between the sub-pixels 3R and 3G adjacent to each other while the quantum dot particles 8G and the metal colloid particles 9G, which propagate the green light, are contained on the other side, so that the wavelengths of light to be propagated are different from each other.

In other words, in the example, the boundary BD between the sub-pixels 3R and 3G adjacent to each other is defined also by an area where the quantum dot particles 8R and the metal colloid particles 9R, which propagate the red light, are contained and an area where the quantum dot particles 8G and the metal colloid particles 9G, which propagate the green light, are contained.

The invention is not limited to this, and a colorless region that does not contain the quantum dot particles 8 and the metal colloid particles 9 may be provided in the vicinity of the boundary BD between the sub-pixels 3R and 3G adjacent to each other in the pixel isolation insulating film 45. Conversely, the colorless region not containing the quantum dot particles 8 and the metal colloid particles 9 may be provided in the vicinity of the opening 45a of the pixel isolation insulating film 45.

According to the first example described above, the quantum dot particles 8 and the metal colloid particles 9, which are contained in the pixel isolation insulating film 45, receive the white light emitted from the organic film 6 formed inside the opening 45a, and propagate light at a specific wavelength in various directions, and therefore, light contributing to display can be increased.

Especially, since the quantum dot particles 8 absorb a short-wavelength side component contained in the white light and emits fluorescence, the intensity of light at a specific wavelength can be increased.

Moreover, since the quantum dot particles 8 and the metal colloid particles 9 propagate lights of colors corresponding to the colors of the color filters 7R and 7G, light intensity degradation is less even when light passes through the color filters 7R and 7G. Moreover, since light from the quantum dot particles 8 and the metal colloid particles 9 passes through the color filters 7R and 7G, the light can be matched to the colors of the color filters 7R and 7G even when the wavelength range is slightly shifted.

Instead of the quantum dot particles 8 and the metal colloid particles 9, for example particles that scatter the white light emitted from the organic film 6 may be contained in the pixel isolation insulating film 45. Portion of the scattered white light passes through the color filters 7R and 7G and is extracted as lights of the respective colors.

Further in the embodiment, a portion of the pixel isolation insulating film 45 that contains the quantum dot particles 8R and the metal colloid particles 9R, which propagate red light, and a portion of the pixel isolation insulating film 45 that contains the quantum dot particles 8G and the metal colloid particles 9G, which propagate green light, are adjacent to each other with the boundary BD therebetween. According to this configuration, a color mixture between the sub-pixels 3R and 3G adjacent to each other can be suppressed.

When the pixel isolation insulating film 45 does not contain the quantum dot particles 8 and the metal colloid particles 9 as in a conventional one, light emitted in one of the sub-pixels 3R and 3G adjacent to each other may pass through the pixel isolation insulating film 45 to reach the other and cause a color mixture.

In contrast to this, since white light emitted in the red sub-pixel 3R is converted to red light in the portion containing the quantum dot particles 8R and the metal colloid particles 9R in the embodiment, the red light disappears even when the red light crosses over the boundary BD and is incident on the portion containing the quantum dot particles 8G and the metal colloid particles 9G, which propagate green light. Similarly, since white light emitted in the green sub-pixel 3G is converted to green light in the portion containing the quantum dot particles 8G and the metal colloid particles 9G, the green light disappears even when the green light crosses over the boundary BD and is incident on the portion containing the quantum dot particles 8R and the metal colloid particles 9R, which propagate red light. In this manner, a color mixture between the sub-pixels 3R and 3G adjacent to each other can be suppressed.

Although the above description has focused on the cross-sections of the red sub-pixel 3R and the green sub-pixel 3G, the blue sub-pixel 3B also has a configuration similar to the red sub-pixel 3R and the green sub-pixel 3G and thus a similar advantageous effect can be obtained. The quantum dot particles 8 and the metal colloid particles 9 are preferably not contained in the white sub-pixel 3W. Moreover, although the case where the organic film 6 emits white light has been described in the above description, a similar advantageous effect can be obtained by appropriately adjusting conditions such as the material or particle diameter of the quantum dot particles 8 and the metal colloid particles 9 also in the case where the adjacent pixels emit lights of colors different from each other.

[Second Example of Pixel Structure]

Figure 4:
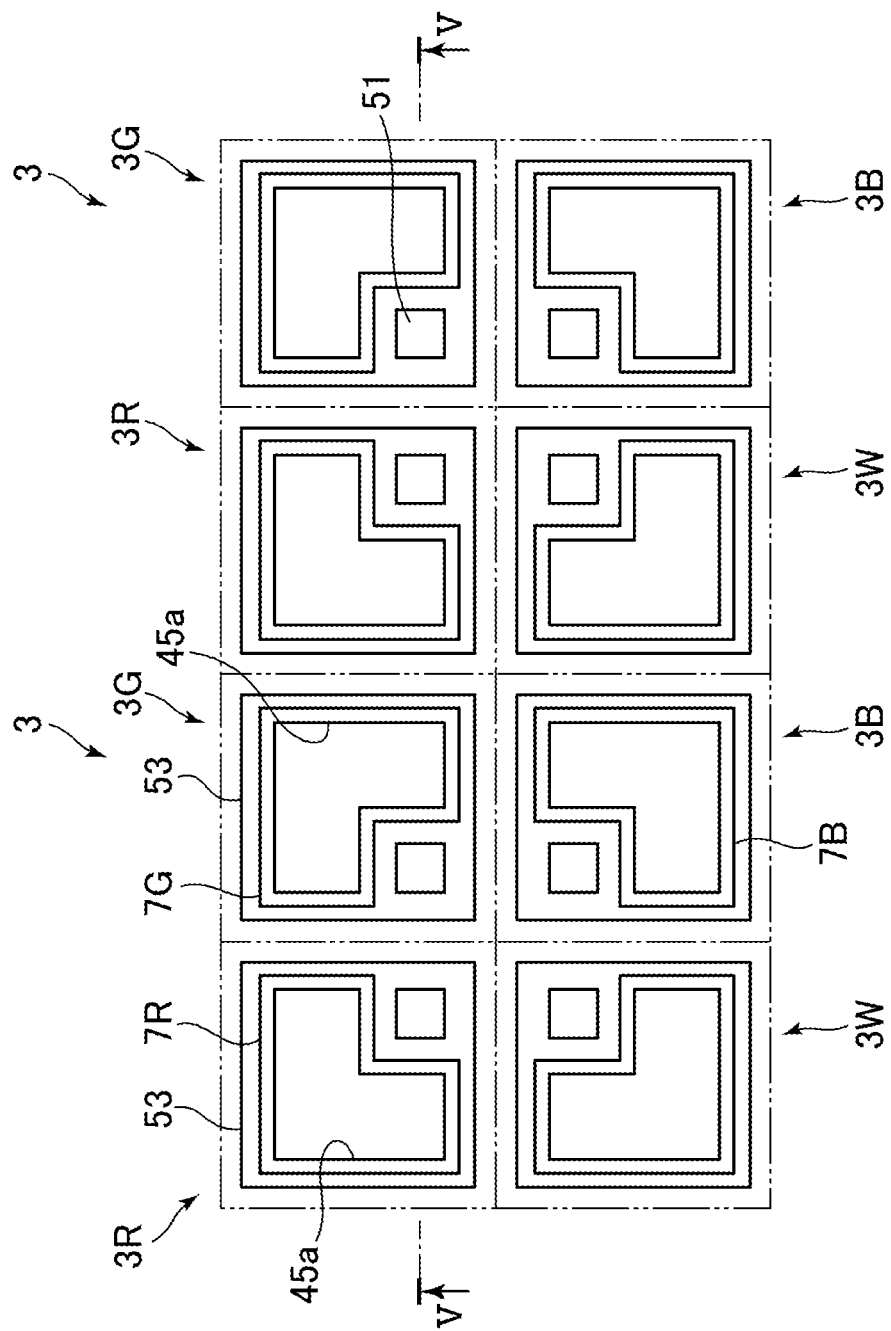
FIG. 4 is a plan view showing a second example of the pixel structure.
Figure 5:
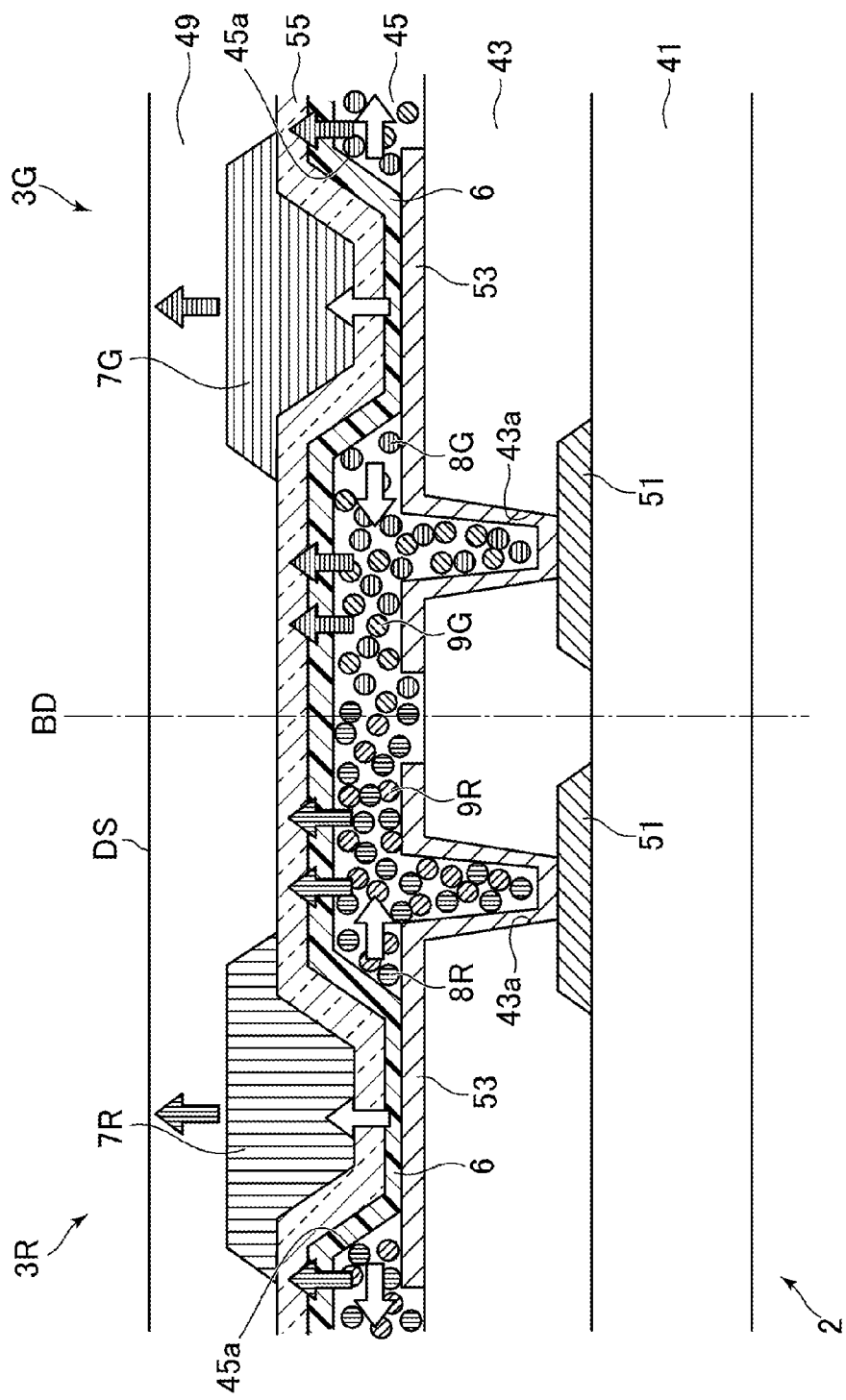
FIG. 5 is a cross-sectional view showing the second example of the pixel structure.

FIGS. 4 and 5 are a plan view and a cross-sectional view, respectively, showing a second example of the pixel structure. FIG. 5 schematically shows a cross-section taken along line V-V in FIG. 4. Configurations overlapping those of the above example are denoted by the same numerals and signs, and a detailed description may be omitted.

In the example, the pixel isolation insulating film 45 includes a portion that is not covered by the color filters 7R and 7G in the area from the opening 45a to the boundary BD. In the example, the boundary BD between the sub-pixels 3R and 3G adjacent to each other is defined by the area where the quantum dot particles 8R and the metal colloid particles 9R, which propagate red light, are contained and the area where the quantum dot particles 8G and the metal colloid particles 9G, which propagate green light, are contained.

When receiving the white light emitted from the organic film 6, the quantum dot particles 8R and the metal colloid particles 9R, which are contained in the red sub-pixel 3R, propagate red light in various directions. Portion of the red light travels upward and reaches the display surface DS without passing through the color filter 7R.

When receiving the white light emitted from the organic film 6, the quantum dot particles 8G and the metal colloid particles 9G, which are contained in the green sub-pixel 3G, propagate green light in various directions. Portion of the green light travels upward and reaches the display surface DS without passing through the color filter 7G.

According to the second example described above, even when the color filters 7R and 7G are not extended to the boundary BD between the sub-pixels 3R and 3G, the quantum dot particles 8 and the metal colloid particles 9 cause the lights of colors corresponding to the colors of the color filters 7R and 7G to reach the display surface DS.

Since the color filters 7R and 7G are not extended to the boundary BD between the sub-pixels 3R and 3G as described above, a higher density of the pixels 3 can be easily achieved. Moreover, although the case where the organic film 6 emits white light has been described in the above description, a similar advantageous effect can be obtained by appropriately adjusting conditions such as the material or particle diameter of the quantum dot particles 8 and the metal colloid particles 9 also in the case where the adjacent pixels emit lights of colors different from each other.

[Third Example of Pixel Structure]

Figure 6:
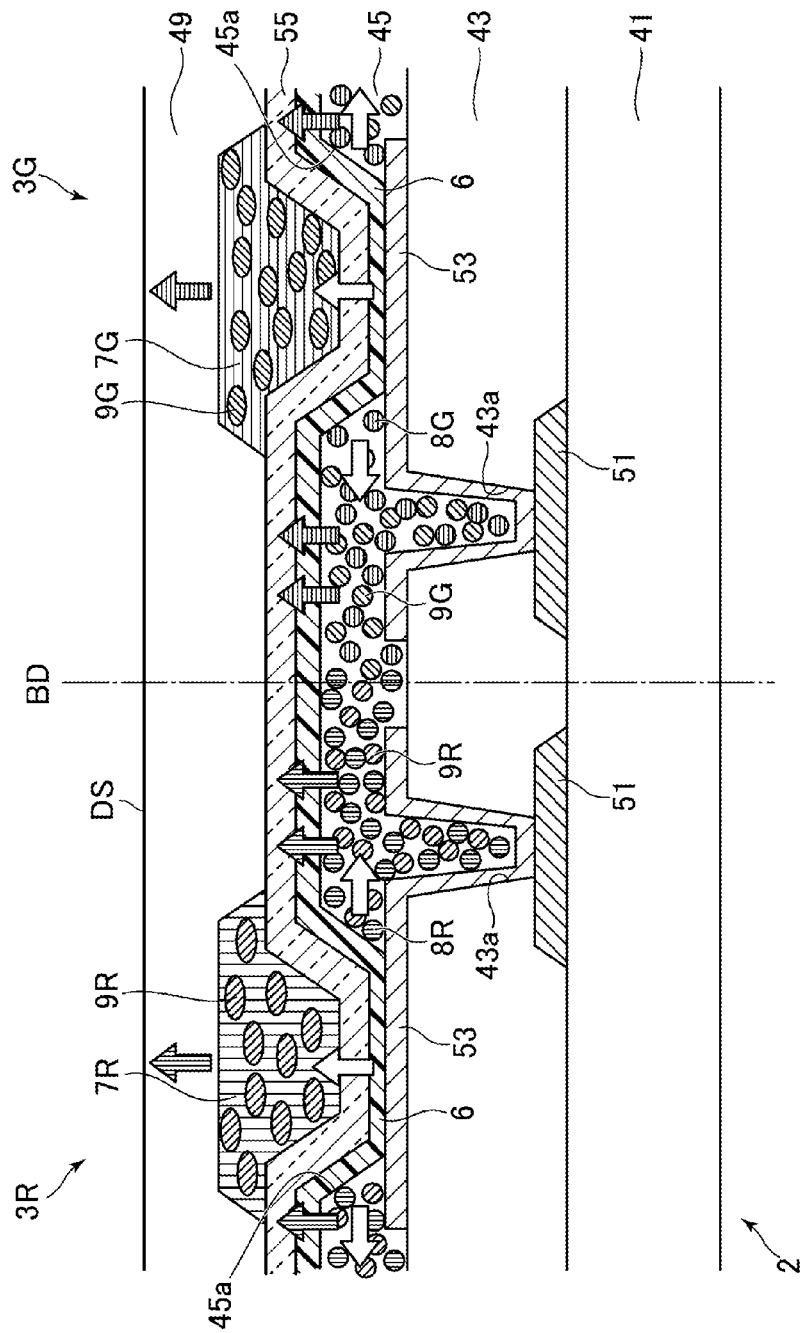
FIG. 6 is a cross-sectional view showing a third example of the pixel structure.

FIG. 6 is a cross-sectional view showing a third example of the pixel structure. Configurations overlapping those of the above example are denoted by the same numerals and signs, and a detailed description may be omitted.

In the example, the color filters 7R and 7G contain the metal colloid particles 9. Lights that pass through the color filters 7R and 7G are converted by the color filters 7R and 7G to lights of the respective colors, and converted also by the metal colloid particles 9 to lights of colors corresponding to the colors of the color filters 7R and 7G.

Specifically, the metal colloid particles 9R contained in the red color filter 7R are adjusted in size so as to propagate red light, which is of the same color as the color filter 7R. Light that passes through the red color filter 7R is converted by the color filter 7R to red light, and converted also by the metal colloid particles 9R to red light.

Similarly, the metal colloid particles 9G contained in the green color filter 7G are adjusted in size so as to propagate green light, which is of the same color as the color filter 7G. Light that passes through the green color filter 7G is converted by the color filter 7G to green light, and converted also by the metal colloid particles 9G to green light.

According to the third example described above, the color filters 7R and 7G contain the metal colloid particles 9, so that the colors of the lights passing through the color filters 7R and 7G can be adjusted. Moreover, although the case where the organic film 6 emits white light has been described in the above description, a similar advantageous effect can be obtained by appropriately adjusting conditions such as the material or particle diameter of the quantum dot particles 8 and the metal colloid particles 9 also in the case where the adjacent pixels emit lights of colors different from each other.

[Manufacturing Step of Display Device]

FIGS. 7(a) to 7(e) are step diagrams showing the manufacturing step of the display device 1. In the following description, in the manufacturing step of the display device 1, a step for forming the pixel isolation insulating film 45 containing the quantum dot particles 8 and the metal colloid particles 9 will be described.

Figure 7:
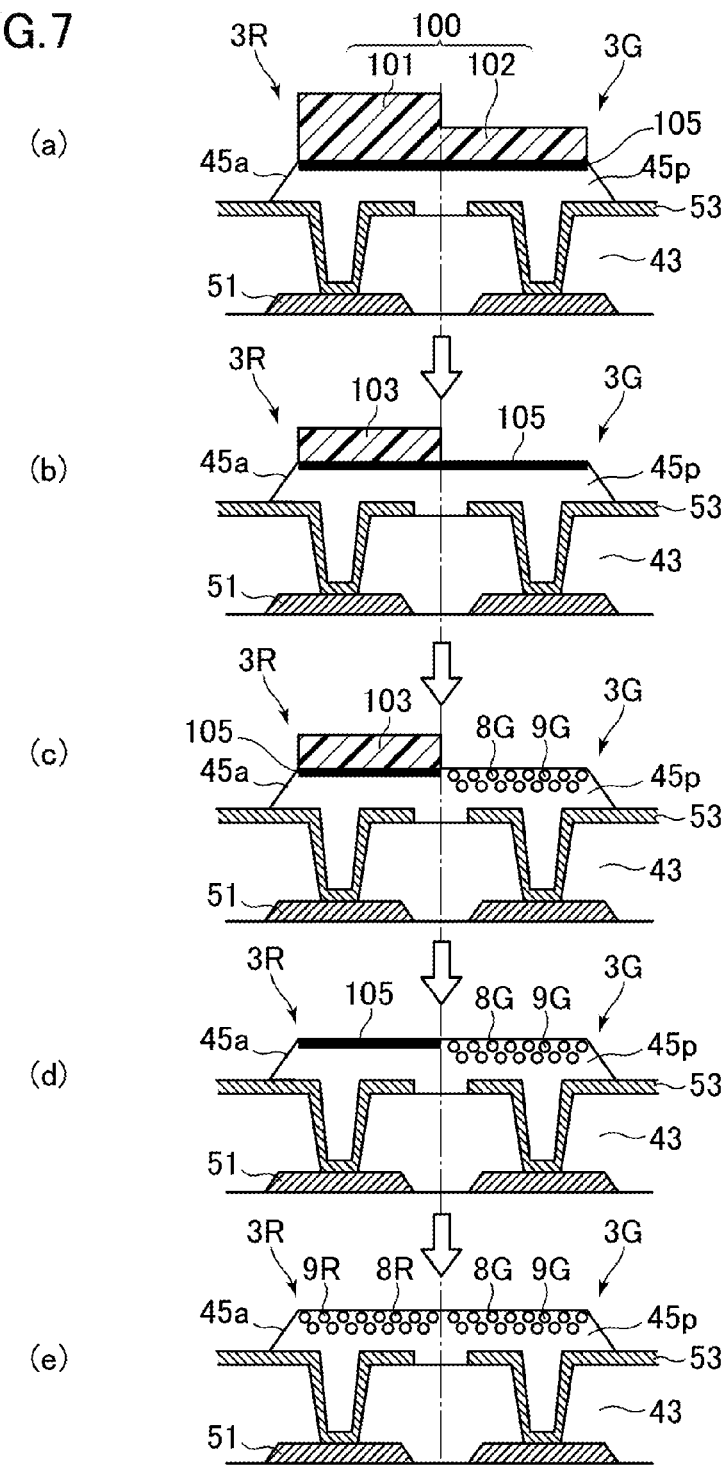
FIG. 7 is a step diagram showing the manufacturing step of the display device.

In FIG. 7(a), a covering film 45p serving as the pixel isolation insulating film 45 is deposited on the insulating film 43 and the pixel electrodes 53, and the openings 45a are formed. The deposition of the covering film 45p is realized by a coating method such as, for example, spin coating. The formation of the opening 45a is realized by photo-etching using a resist 100.

Here, the resist 100 includes a high-profile portion 101 and a low-profile portion 102 different in height from each other. The high-profile portion 101 and the low-profile portion 102 are respectively formed in the areas of the sub-pixels 3R and 3G. For example, the high-profile portion 101 is formed in the area of the red sub-pixel 3R, and the low-profile portion 102 is formed in the area of the green sub-pixel 3G.

Moreover, an adsorbent 105 for the adsorption of the quantum dot particles 8 and the metal colloid particles 9 is previously coated between the covering film 45p and the resist 100. The invention is not limited to this, and an adsorbent may be previously mixed into the covering film 45p.

In FIG. 7(b), a portion of the resist 100 in the thickness direction is removed by half-asking. With this removal, a remaining portion 103, which is a portion of the high-profile portion 101 that remains, is formed in the area of the high-profile portion 101, and the adsorbent 105 is exposed in the area of the low-profile portion 102.

In FIG. 7(c), the quantum dot particles 8 and the metal colloid particles 9 adsorb onto an area of the surface of the covering film 45p where the low-profile portion 102 is removed to expose the adsorbent 105. For example, the quantum dot particles 8G and the metal colloid particles 9G, which propagate green light, adsorb onto the adsorbent 105 exposed in the area of the green sub-pixel 3G.

In FIG. 7(d), the remaining portion 103 of the resist 100 is removed by full-ashing. With this removal, the adsorbent 105 is exposed in the area of the remaining portion 103.

In FIG. 7(e), the quantum dot particles 8 and the metal colloid particles 9 adsorb onto an area of the surface of the covering film 45p where the remaining portion 103 is removed to expose the adsorbent 105. For example, the quantum dot particles 8R and the metal colloid particles 9R, which propagate red light, adsorb onto the adsorbent 105 exposed in the area of the red sub-pixel 3R.

In the manner as described above, the pixel isolation insulating film 45 containing the quantum dot particles 8 and the metal colloid particles 9 at the surface layer portion is formed. When the quantum dot particles 8 and the metal colloid particles 9 are caused to adsorb also onto the area of the blue sub-pixel 3B, the resist 100 may be subjected to ashing in three steps.

The invention is not limited to the above method. For example, the portion of the pixel isolation insulating film 45 containing the quantum dot particles 8R and the metal colloid particles 9R, which propagate red light, and the portion of the pixel isolation insulating film 45 containing the quantum dot particles 8G and the metal colloid particles 9G, which propagate green light, may be individually formed.

In the embodiment, the organic EL display device has been illustrated as an example of the disclosure. However, it is needless to say that the invention is applicable to other self-emitting-type display devices. Moreover, it is needless to say that the invention is applicable to small or medium to large-sized display devices without particular limitation.

Various variations and modifications can be conceived by those skilled in the art within the idea of the invention, and it will be understood that all such variations and modifications also fall within the scope of the invention. For example, when those skilled in the art appropriately add or remove components or change the designs of components in the embodiment described above, or add or omit steps or change the conditions of steps in the embodiment described above, such variations are included in the scope of the invention as long as they come within the spirit of the invention.

While there have been described what are at present considered to be certain embodiments of the invention, it will be understood that various modifications may be made thereto, and it is intended that the appended claims cover all such modifications as fall within the true spirit and scope of the invention. For example, those skilled in the art can appropriately modify the above-mentioned embodiments by addition, deletion, or design change of components, or by addition, omission, or condition change of steps, and such modifications are also encompassed within the scope of the invention as long as they fall within the spirit of the invention.

What is claimed is:

1. A display device comprising:
a pixel electrode;
a pixel isolation insulating film in which an opening through which the pixel electrode is exposed at a bottom is formed; and
a light-emitting layer formed inside the opening, wherein
the pixel isolation insulating film contains particles that receive light emitted from the light-emitting layer and propagate light in a direction different from that of the light emitted from the light-emitting layer,
wherein the opening formed in the pixel isolation insulating film includes a first opening and a second opening adjacent to each other, and
in a portion of the pixel isolation insulating film between the first opening and the second opening, the particles that are contained on a side close to the first opening and the particles that are contained on a side close to the second opening propagate lights at wavelengths different from each other.

2. The display device according to claim 1, wherein
the particles receive the light emitted from the light-emitting layer and propagate light at a specific wavelength in a direction different from that of the light emitted from the light-emitting layer.

3. The display device according to claim 1, further comprising a color filter disposed above the light-emitting layer, wherein
the particles receive the light emitted from the light-emitting layer and propagate light of a color corresponding to a color of the color filter in a direction different from that of the light emitted from the light-emitting layer.

4. The display device according to claim 3, wherein
the pixel isolation insulating film includes a portion that is not covered by the color filter in an area from the opening to a boundary between pixels.

5. The display device according to claim 1, further comprising a color filter disposed above the light-emitting layer and covering an area of the pixel isolation insulating film from the opening to a boundary between pixels.

6. The display device according to claim 1, wherein
the particles receive the light emitted from the light-emitting layer and propagate light of a color corresponding to a color of the light emitted from the light-emitting layer in a direction different from that of the light emitted therefrom.

7. The display device according to claim 1, wherein
the particles include a quantum dot particle.

8. The display device according to claim 1, wherein
the particles include a metal colloid particle.

9. The display device according to claim 1, wherein
the particles include a quantum dot particle and a metal colloid particle.

10. The display device according to claim 1, further comprising a color filter disposed above the light-emitting layer and containing a metal colloid particle.

* * * * *